United States Patent
Barnowski et al.

(10) Patent No.: US 7,024,759 B2
(45) Date of Patent: Apr. 11, 2006

(54) ASSEMBLY DEVICE COMPRISING SEVERAL TRANSPORT LINES FOR SUBSTRATES TO BE ASSEMBLED

(75) Inventors: Frank Barnowski, Munich (DE); Mohammed Mehdianpour, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 417 days.

(21) Appl. No.: 10/149,705

(22) PCT Filed: Dec. 12, 2000

(86) PCT No.: PCT/DE00/04418

§ 371 (c)(1),
(2), (4) Date: Oct. 25, 2002

(87) PCT Pub. No.: WO01/45482

PCT Pub. Date: Jun. 21, 2001

(65) Prior Publication Data

US 2003/0145454 A1    Aug. 7, 2003

(30) Foreign Application Priority Data

Dec. 16, 1999    (DE) ................................ 199 60 799

(51) Int. Cl.
*B23P 19/00* (2006.01)

(52) U.S. Cl. ................. 29/740; 29/739; 29/741; 29/832; 29/429; 29/434; 414/285

(58) Field of Classification Search ................. 29/739, 29/740, 741, 832, 837, 428, 429, 43; 414/285, 414/286; 198/472

See application file for complete search history.

(56) References Cited

U.S. PATENT DOCUMENTS

| 2,890,456 | A |   | 6/1959 | Runciman |
| 4,470,741 | A | * | 9/1984 | Bossler et al. ............... 414/280 |
| 6,199,272 | B1 | * | 3/2001 | Seto et al. .................... 29/740 |
| 6,789,310 | B1 | * | 9/2004 | Hata et al. .................... 29/740 |

FOREIGN PATENT DOCUMENTS

| EP | 0 302 542 A | 2/1989 |
| EP | 0 413 098 A | 2/1991 |
| WO | WO 99 59389 A | 11/1999 |

* cited by examiner

*Primary Examiner*—Richard Chang
(74) *Attorney, Agent, or Firm*—Harness, Dickey & Pierce, P.L.C.

(57) ABSTRACT

Substrates can be transported on a top transporting section to component-fitting locations of a component-fitting apparatus. Conveying sections for substrates which are to be routed past the component-fitting locations are arranged on a number of conveying levels beneath the transporting section.

38 Claims, 1 Drawing Sheet

ASSEMBLY DEVICE COMPRISING SEVERAL TRANSPORT LINES FOR SUBSTRATES TO BE ASSEMBLED

This application is the national phase under 35 U.S.C. § 371 of PCT International Application No. PCT/DE00/04418 which has an International filing date of Dec. 12, 2000, which designated the United States of America and which claimed priority on German patent application no. 19960799.0 filed Dec. 16, 1999, the entire contents of which are hereby incorporated by reference.

FIELD OF THE INVENTION

The invention generally relates to an apparatus for fitting electrical components on substrates. Preferably, it is possible for the substrates, in at least one transporting section of a top level, to be transported to a component-fitting location and away from the same. In addition, installation locations for additional conveying sections for the substrates are preferably provided beneath the transporting section.

BACKGROUND OF THE INVENTION

EP 0 413 089 A has disclosed a continuous installation for handling piece goods, in the case of which a plurality of handling sections are arranged, with a large amount of time being required, in segments parallel to one another, the piece goods being divided up thereon.

A component-fitting apparatus with additional conveying sections for the substrates has been disclosed, for example, by WO99/59389 A. According to the latter, the additional conveying sections are intended to subdivide long assembly lines into a plurality of segments in which a printed circuit board can be fitted out completely in each case. Provision is made here for an additional transporting level to be introduced beneath a component-fitting section, two conveying sections located one beside the other on said transporting level serving for feeding the substrates to the sub-segments and for removing the finished substrates from the sub-segments. Transfer arrangements are arranged upstream and downstream of the sub-segments and can transfer the substrates between the various sections. This means that the transfer arrangement has to be capable of displacement not just in height but also laterally, which is associated with a correspondingly high level of drive-related and guidance-related outlay.

In particular in the case of wide printed circuit boards, it is necessary to provide, for the two conveying sections, an installation width which results in an increase in the structural width of the component-fitting apparatus and thus in an increase in the standing surface area. There is thus also an increase in the distance between the component-fitting area and the peripherally provided feed arrangements for the electrical components. The displacement paths of a component-fitting head become correspondingly larger, as a result of which the component-fitting capacity decreases.

SUMMARY OF THE INVENTION

An object of an embodiment of the invention is to reduce the amount of space required as well as the apparatus-related outlay.

As a result of the two conveying sections being arranged on two levels located vertically directly one above the other, the transfer arrangements only have to be displaced in onedirection, as a result of which the design outlay decreases.

Since the substrates, in the form of flat printed circuit boards, are usually of a low overall height, the distance between the conveying sections can be kept small, with the result that the displacement paths are considerably shorter than in the case of lateral displacement. The installation width for the conveying sections can be more or less halved, as a result of which the component-fitting apparatus may be of correspondingly compact design.

The transverse connecting parts can make it possible to stabilize the chassis of the component-fitting apparatus in the immediate vicinity of the component-fitting level, with the result that there is no adverse effect to the component-fitting accuracy even in the case of a relatively large free space for the conveying sections. The transverse connecting parts may serve, at the same time, as bearing means for the transporting section or for a component-fitting table of the transporting section.

Short height intervals between the various sections can result in short displacement paths, with the result that the transfer device can be displaced quickly between the various levels.

A development can make it possible for turned substrates to be transported back in a space-saving manner within the component-fitting apparatus to the start of a component-fitting line and guided through the component-fitting line again in order for the second substrate side to be fitted out. All the conveying sections, including the return section, may be combined in a single compact arrangement and served by the transfer arrangements. Just one additional conveying section is necessary here for the return section, and the travel of the transfer device merely has to be increased to a slight extent.

The form of the chassis can result in a straightforward structure which can easily be produced by casting and is of high rigidity and dynamic strength.

The inspection opening can allow access to the conveying sections in the case of disruption.

The carrier can allow external assembly of the conveying sections including all the drives, actuating devices and control devices. This results in a fully prefabricated conveying module which can easily be pushed into the free space available. It is advantageous here for the supporting bearings to be arranged on the two end sides of the component-fitting apparatus, with the result that the carrier can be fastened at easily accessible locations.

The channel-like cross section of the carrier can result in a dimensionally stable load-bearing structure with low production outlay. It is possible for turned substrates to be transported back in a space-saving manner within the component-fitting apparatus to the start of a component-fitting line and guided through the component-fitting line again in order for the second substrate side to be fitted out.

BRIEF DESCRIPTION OF THE DRAWINGS

The invention is explained in more detail hereinbelow with reference to an exemplary embodiment illustrated in the drawings, in which.

DETAILED DESCRIPTION OF THE PREFERRED EMBODIMENTS

Figure 1:
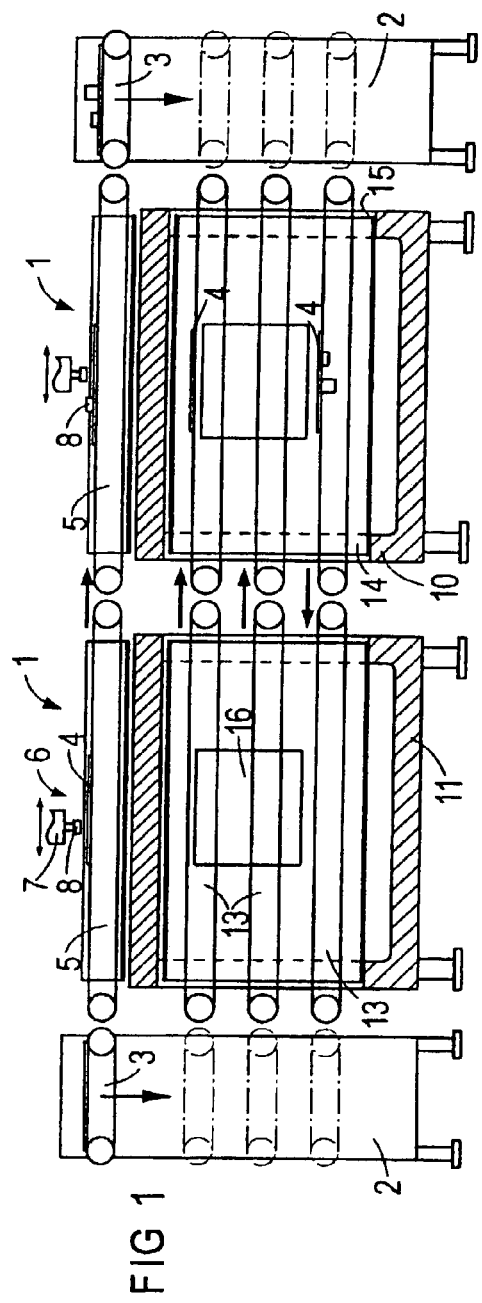
FIG. 1 shows, schematically, a longitudinal section through two component-fitting apparatuses which follow directly one after the other and have transfer arrangements.
Figure 2:
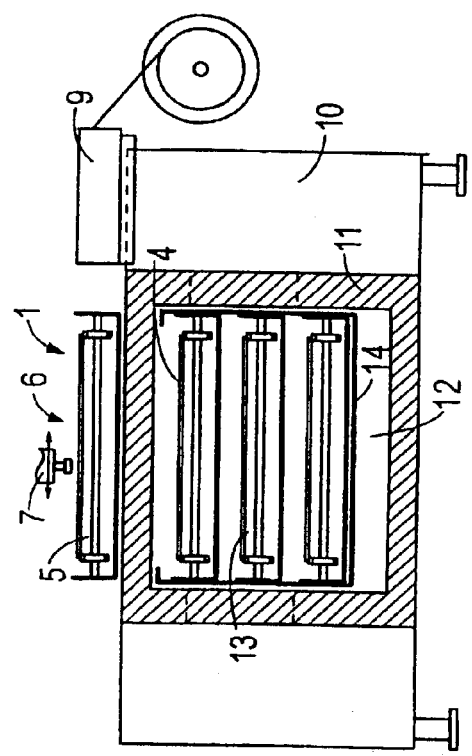
FIG. 2 shows a cross section through the component-fitting apparatus according to FIG. 1.

According to FIGS. 1 and 2, transfer arrangements 2 are arranged on both sides of two component-fitting apparatuses 1 following one after the other, the transfer arrangements being provided with vertically displaceable transfer devices 3 for substrates 4. On a top component-fitting level, the component-fitting apparatus 1 has a transporting section 5, in the central region of which there is arranged a component-fitting location 6, above which a component-fitting head 7 can be displaced in two coordinate directions. The component-fitting head 7 serves for fetching electrical components 8 from feed arrangements 9 and positioning them on the substrate 4.

The component-fitting apparatus 1 has a chassis 10, which is designed, beneath the transporting section 5, as a chassis part 11 of rectangular tubular cross section. The chassis part 11, which is open at both ends, forms a free space 12 with installation locations for conveying sections 13, which run vertically beneath the transporting section 5 and parallel to the latter. The transfer device 3 can be displaced vertically between the transporting section 5 and the conveying sections 13 and can introduce the substrates 4 into the various sections and discharge them therefrom.

There are three conveying sections provided one above the other, of which the uppermost one serves as a feed section for the substrates which have not been fitted, the central one serves as a removal section for the finished substrates 4 and the lowermost one serves as a return section for substrates 4 which are fitted out on one side and can be introduced into the transporting section 5 in a turned state in order for the second substrate side to be fitted out.

The chassis part 11 has lateral inspection openings 14 through which, in the case of disruption, the inner segments of the conveying sections 13 are accessible. The conveying sections 13 are retained in a carrier 14 which is bent in the form of a U and, together with the preassembled conveying sections 13, can be pushed longitudinally into the free space 12. The carrier 14 is fastened on supporting bearings 15 on both end sides of the chassis 10. The transporting section 5 is provided on the top side of the tubular chassis part 11, with the result that the top tube wall is located between the transporting section 5 and the conveying section 13 located therebeneath.

LIST OF DESIGNATIONS

1 Component-fitting apparatus
2 Transfer apparatus
3 Transfer device
4 Substrate
5 Transporting section
6 Component-fitting location
7 Component-fitting head
8 Component
9 Feed arrangement
10 Chassis
11 Chassis part
12 Free space
13 Conveying section
14 Carrier
15 Supporting bearing
16 Inspection opening The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An apparatus for fitting electrical components on a substrate, comprising:
    a transporting section of a first level, adapted to transport a substrate to and away from a component-fitting location;
    a plurality of conveying sections, wherein installation locations for the plurality of conveying sections are arranged on at least two conveying levels located one above the other;
    transverse connecting parts of a chassis of the apparatus, arranged between the transporting section and the conveying sections, wherein at least one longitudinally continuous free space is formed beneath the transverse connecting parts and the conveying sections of the chassis; and
    a tubular chassis part, extending in the conveying direction, wherein a cavity is formed in the free space thereof, wherein a top tube wall of the chassis part forms the transverse connecting parts, and wherein the transporting section is provided on the top tube wall.

2. An assembly device, including a plurality of component-fitting apparatus as claimed in claim 1, wherein the plurality of the component-fitting apparatuses are subdivided into a plurality of sub-segments in which the substrates are component fitted, and wherein a transfer arrangement including transfer devices for the substrates, adapted to be displaced vertically between various sections, is arranged at least on a side of a sub-segment.

3. The component-fitting apparatus as claimed in claim 1, wherein at least one of the conveying sections is operateable as a return section for substrates which have already been fitted with components on one side.

4. The component-fitting apparatus as claimed in claim 1, wherein the chassis part is provided with at least one longitudinal-side inspection opening.

5. The component-fitting apparatus as claimed in claim 1, wherein the chassis part includes supporting bearings for a carrier, on which the conveying sections are fastenable.

6. The component-fitting apparatus as claimed in claim 5, wherein the carrier, with the conveying sections fastened thereon, is pushable into the free space in the transporting direction.

7. The component-fitting apparatus as claimed in claim 5, wherein the carrier includes a load-bearing metal sheet, bent in the form of a U in a channel-like manner.

8. An assembly device as claimed in claim 2, wherein at least one of the conveying sections is operateable as a return section for substrates which have already been fitted with components on one side.

9. The component-fitting apparatus as claimed in claim 4, wherein the chassis part includes supporting bearings for a carrier, on which the conveying sections are fastenable.

10. The component-fitting apparatus as claimed in claim 9, wherein the carrier, with the conveying sections fastened thereon, is pushable into the free space in the transporting direction.

11. The component-fitting apparatus as claimed in claim 6, wherein the carrier includes a load-bearing metal sheet, bent in the form of a U in a channel-like manner.

12. The component-fitting apparatus as claimed in claim 1, comprising:
    a return section for substrates which are fitted with components on one side, wherein an installation location for a conveying section, which serves as the return section, is provided beneath the transporting section.

13. The component-fitting apparatus as claimed in claim 12, wherein at least two conveying levels for installation locations located one above the other are provided, one serving to accommodating a conveying section which transports in the forward direction and another being provided for a conveying section which serves as the return section.

14. The component-fitting apparatus as claimed in claim 1, wherein the plurality of conveying sections are arranged on a plurality of conveying levels beneath the transporting section.

15. The component-fitting apparatus as claimed in claim 1, further comprising:
a transfer device, vertically displaceable between the transporting section and the conveying sections, adapted to convey substrates at least one of to and from the transporting and conveying sections.

16. An assembly device, including a plurality of apparatuses as claimed in claim 1.

17. The assembly device of claim 16, wherein the plurality of conveying sections are arranged on a plurality of conveying levels beneath the transporting section.

18. An assembly device as claimed in claim 16, wherein at least one of the conveying sections is operateable as a return section for substrates which have already been fitted with components on one side.

19. An assembly device as claimed in claim 17, wherein at least one of the conveying sections is operateable as a return section for substrates which have already been fitted with components on one side.

20. An assembly device as claimed in claim 16, further comprising:
a transfer arrangement including transfer devices for the substrates, adapted to be displaced vertically between various sections, is arranged at least on a side of a component-fitting apparatus.

21. An apparatus for placing electrical components on a substrate, comprising:
a transporting section, adapted to transport a substrate to and away from a component-placing location;
a plurality of conveying sections, arranged on at least two conveying levels located one above the other, and located beneath the transporting section; and
a chassis having transverse connecting parts arranged between the transporting section and the conveying sections, wherein at least one longitudinally continuous free space is formed beneath the conveying sections of the chassis,
wherein the chassis is a tubular chassis part, extending in the conveying direction, wherein a cavity is formed in the free space thereof wherein a top tube wall of the chassis part forms the transverse connecting parts and wherein the transporting section is provided on the top tube wall.

22. The apparatus as claimed in claim 21, further comprising:
a return section for substrates which are fitted with components on one side, wherein an installation location for a conveying section, which serves as the return section, is provided beneath the transporting section.

23. The apparatus as claimed in claim 22, wherein at least two conveying levels for installation locations located one above the other are provided, one serving to accommodating a conveying section which transports in the forward direction and another being provided for a conveying section which serves as the return section.

24. The apparatus as claimed in claim 21, further comprising:
a transfer device, vertically displaceable between the transporting section and the conveying sections, adapted to convey substrates at least one of to and from the transporting and conveying sections.

25. The apparatus as claimed in claim 21, wherein at least one of the conveying sections is operateable as a return section for substrates which have already been fitted with components on one side.

26. The apparatus as claimed in claim 21, wherein the chassis part is provided with at least one longitudinal-side inspection opening.

27. The apparatus as claimed in claim 21, wherein the chassis part includes supporting bearings for a carrier, on which the conveying sections are fastenable.

28. The apparatus as claimed in claim 27, wherein the carrier, with the conveying sections fastened thereon, is pushable into the free space in the transporting direction.

29. The apparatus as claimed in claim 27, wherein the carrier includes a load-bearing metal sheet, bent in the form of a U in a channel-like manner.

30. An apparatus for placing electrical components on a substrate, comprising:
a transporting section, adapted to transport a substrate to and away from a component-placing location;
a plurality of conveying sections, arranged on at least two conveying levels located one above the other, and located beneath the transporting section; and
a transfer device, vertically displaceable between the transporting section and the conveying sections, adapted to convey substrates at least one of to and from the transporting and conveying sections; and
a tubular chassis part, extending in the conveying direction wherein a cavity is formed in the free space thereof, wherein a top tube wall of the chassis part forms transverse connecting parts arranged between the transporting section and the conveying sections, and wherein the transporting section is provided on the top tube wall.

31. The apparatus as claimed in claim 30, wherein at least one of the conveying sections is operateable as a return section for substrates which have already been fitted with components on one side.

32. The apparatus as claimed in claim 30, wherein the chassis part is provided with at least one longitudinal-side inspection opening.

33. The apparatus as claimed in claim 30, wherein the chassis part includes supporting bearings for a carrier, on which the conveying sections are fastenable.

34. The apparatus as claimed in claim 33, wherein the carrier, with the conveying sections fastened thereon, is pushable into the free space in the transporting direction.

35. The apparatus as claimed in claim 33, wherein the carrier includes a load-bearing metal sheet, bent in the form of a U in a channel-like manner.

36. The apparatus as claimed in claim 30, comprising:
a return section for substrates which are fitted with components on one side, wherein an installation loca tion for a conveying section, which serves as the return section, is provided beneath the transporting section.

37. The apparatus as claimed in claim 36, wherein at least two conveying levels for installation locations located one above the other are provided, one serving to accommodating a conveying section which transports in the forward direction and another being provided for a conveying section which serves as the return section.

38. The apparatus as claimed in claim 30, wherein the plurality of conveying sections are arranged on a plurality of conveying levels beneath the transporting section.

* * * * *